(12) United States Patent
Oh et al.

(10) Patent No.: US 10,998,351 B2
(45) Date of Patent: May 4, 2021

(54) SOURCE DRIVE INTEGRATED CIRCUIT, METHOD OF MANUFACTURING THE SAME, AND DISPLAY APPARATUS INCLUDING THE SOURCE DRIVE INTEGRATED CIRCUIT

(71) Applicant: SILICON WORKS CO., LTD., Daejeon (KR)

(72) Inventors: Myeong Woo Oh, Daejeon (KR); Cheol Woong Lee, Daejeon (KR); Byeong Jae Park, Daejeon (KR); Dong Geon Lee, Daejeon (KR); Tae Woo Ryu, Daejeon (KR)

(73) Assignee: SILICON WORKS CO., LTD., Daejeon (KR)

( * ) Notice: Subject to any disclaimer, the term of this patent is extended or adjusted under 35 U.S.C. 154(b) by 29 days.

(21) Appl. No.: 16/514,266

(22) Filed: Jul. 17, 2019

(65) Prior Publication Data

US 2020/0027905 A1 Jan. 23, 2020

(30) Foreign Application Priority Data

Jul. 19, 2018 (KR) ........................ 10-2018-0083929

(51) Int. Cl.
*G09G 3/32* (2016.01)
*H01L 23/52* (2006.01)
(Continued)

(52) U.S. Cl.
CPC ........... *H01L 27/1255* (2013.01); *G09G 3/20* (2013.01); *H01L 27/124* (2013.01);
(Continued)

(58) Field of Classification Search
CPC ........ G09G 3/006; G09G 3/20; G09G 3/2092; G09G 3/2096; G09G 3/32;
(Continued)

(56) References Cited

U.S. PATENT DOCUMENTS 4,672,529 A * 6/1987 Kupersmit ......... G05B 23/0235
700/1
9,378,707 B2 * 6/2016 Lee ...................... G09G 3/3208
(Continued)

FOREIGN PATENT DOCUMENTS

JP 2016-224341 A 12/2016
KR 10-2008-0097620 A 11/2008
(Continued)

*Primary Examiner* — Maliheh Malek
(74) *Attorney, Agent, or Firm* — Harness, Dickey & Pierce, P.L.C.

(57) ABSTRACT

Disclosed are a source drive integrated circuit (IC), a method of manufacturing the same, and a display apparatus including the source drive IC. The source drive IC includes a core portion, a first channel portion disposed outside one side of the core portion, a second channel portion disposed outside the other side of the core portion, a first resistor string provided inward from the one side of the core portion to generate a plurality of gamma voltages, a first resistance corrector provided between the first resistor string and the first channel portion, and a first connection line extending from the first resistor string to each of the first channel portion and the second channel portion and transferring the plurality of gamma voltages to the first channel portion and the second channel portion. The first connection line extends to the first channel portion via the first resistance corrector.

17 Claims, 9 Drawing Sheets

(51) Int. Cl.
*H01L 27/12* (2006.01)
*G09G 3/20* (2006.01)
*G09G 3/36* (2006.01)

(52) U.S. Cl.
CPC . *H01L 27/1296* (2013.01); *G09G 2300/0426* (2013.01); *G09G 2320/0223* (2013.01); *G09G 2320/0276* (2013.01); *G09G 2320/0673* (2013.01); *G09G 2330/028* (2013.01)

(58) Field of Classification Search
CPC ..... G09G 3/3208–3291; G09G 3/3611; G09G 3/3648; G09G 3/3696; G09G 2300/0426; G09G 2310/027; G09G 2310/0289; G09G 2310/0291; G09G 2320/0276; G09G 2320/0693; G09G 2330/027–028; G09G 2330/04; G09G 2330/12; G09G 3/3266; G09G 3/3275; G09G 3/3283; H01L 24/16; H01L 23/4985; H01L 23/5226; H01L 23/5228; H01L 27/0255; H01L 27/0288; H01L 27/0292; H01L 27/0296; H01L 27/124; H01L 27/1269
See application file for complete search history.

(56) References Cited

U.S. PATENT DOCUMENTS

| | | | | |
|---|---|---|---|---|
| 10,741,516 B2* | 8/2020 | Oh | ........................... | H01L 24/06 |
| 2002/0109655 A1* | 8/2002 | Yer | ...................... | G09G 3/3696 |
| | | | | 345/87 |
| 2004/0056868 A1* | 3/2004 | Kato | .................... | G09G 3/3688 |
| | | | | 345/600 |
| 2007/0024540 A1* | 2/2007 | Ryu | ..................... | G09G 3/3233 |
| | | | | 345/76 |
| 2008/0203435 A1* | 8/2008 | Kobayashi | .......... | H01L 27/0251 |
| | | | | 257/203 |
| 2009/0206411 A1* | 8/2009 | Koketsu | .................. | H01L 24/81 |
| | | | | 257/368 |
| 2010/0039422 A1* | 2/2010 | Seto | ...................... | G09G 3/3233 |
| | | | | 345/212 |
| 2010/0264943 A1* | 10/2010 | Matsuno | ................ | G01R 17/02 |
| | | | | 324/705 |
| 2011/0050749 A1* | 3/2011 | Park | ..................... | G09G 3/3291 |
| | | | | 345/690 |
| 2012/0218319 A1* | 8/2012 | Koo | ..................... | G09G 3/3696 |
| | | | | 345/690 |
| 2014/0008793 A1* | 1/2014 | Suzuki | .................... | H01L 24/14 |
| | | | | 257/737 |
| 2015/0108611 A1* | 4/2015 | Kumagai | ........... | H01L 23/5226 |
| | | | | 257/620 |
| 2015/0279524 A1* | 10/2015 | Feng | ...................... | H01C 10/50 |
| | | | | 345/690 |
| 2015/0364463 A1* | 12/2015 | Suzuki | ................ | H01L 27/0255 |
| | | | | 257/355 |
| 2016/0035321 A1* | 2/2016 | Cho | ..................... | G09G 3/2092 |
| | | | | 345/213 |
| 2018/0090083 A1* | 3/2018 | Kim | ..................... | G09G 3/3677 |
| 2018/0144706 A1* | 5/2018 | Cho | ..................... | G09G 3/2096 |
| 2018/0286305 A1* | 10/2018 | Kim | ..................... | G09G 3/2074 |
| 2019/0096300 A1* | 3/2019 | Lin | ......................... | G09G 3/006 |
| 2019/0157231 A1* | 5/2019 | Oh | ....................... | H01L 23/4985 |
| 2019/0340996 A1* | 11/2019 | Kim | ..................... | G09G 3/3696 |
| 2020/0027419 A1* | 1/2020 | Oh | ...................... | G09G 3/3233 |
| 2020/0312208 A1* | 10/2020 | Li | ............................. | G09G 3/20 |
| 2020/0394981 A1* | 12/2020 | Lee | .......................... | G09G 5/10 |

FOREIGN PATENT DOCUMENTS

| | | |
|---|---|---|
| KR | 10-2016-0142015 A | 12/2016 |
| KR | 10-2017-0064748 A | 6/2017 |

* cited by examiner

SOURCE DRIVE INTEGRATED CIRCUIT, METHOD OF MANUFACTURING THE SAME, AND DISPLAY APPARATUS INCLUDING THE SOURCE DRIVE INTEGRATED CIRCUIT

CROSS-REFERENCE TO RELATED APPLICATIONS

This application claims the benefit of the Korean Patent Application No. 10-2018-0083929 filed on Jul. 19, 2018, which is hereby incorporated by reference as if fully set forth herein.

FIELD

The present disclosure relates to a source drive integrated circuit (IC).

BACKGROUND

With the advancement of information-oriented society, various requirements for display apparatuses for displaying an image are increasing. Various display apparatuses such as liquid crystal display (LCD) apparatuses and organic light emitting display apparatuses are being practically used as display apparatuses.

Display apparatuses each include a display panel including a plurality of pixels defined by a plurality of gate lines and a plurality of data lines, a gate driving circuit which supplies a gate signal to the gate lines, and a data driving circuit which supplies data voltages to the data lines.

The data driving circuit includes a plurality of source drive integrated circuits (ICs). Each of the source drive ICs converts data, corresponding to a digital image signal received from a timing controller, into a data voltage corresponding to an analog image signal and outputs the data voltage to a corresponding data line.

The source drive IC includes a plurality of driving circuits and a plurality of lines for connecting the driving circuits. In this case, a length difference between the plurality of lines may occur, and due to this, a resistance deviation between the lines may occur due to the length difference. When a resistance deviation occurs between the plurality of lines, the delay or distortion of a driving signal occurs, causing the degradation in image quality.

SUMMARY

Accordingly, the present disclosure is directed to providing a source drive IC, a method of manufacturing the same, and a display apparatus including the source drive IC that substantially obviate one or more problems due to limitations and disadvantages of the related art.

An aspect of the present disclosure is directed to providing a source drive IC, a method of manufacturing the same, and a display apparatus including the source drive IC, which decrease a resistance deviation between a plurality of lines to reduce the delay or distortion of a driving signal.

The objects of the present disclosure are not limited to the aforesaid, but other objects not described herein will be clearly understood by those skilled in the art from descriptions below.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a source drive IC including a core portion, a first channel portion disposed outside one side of the core portion to receive data corresponding to a digital image signal from the core portion to output a data voltage corresponding to an analog image signal, a second channel portion disposed outside the other side of the core portion to receive data corresponding to a digital image signal from the core portion to output a data voltage corresponding to an analog image signal, a first resistor string provided inward from the one side of the core portion to generate a plurality of gamma voltages, a first resistance corrector provided between the first resistor string and the first channel portion, and a first connection line extending from the first resistor string to each of the first channel portion and the second channel portion and transferring the plurality of gamma voltages to the first channel portion and the second channel portion, wherein the first connection line extends to the first channel portion via the first resistance corrector.

In another aspect of the present disclosure, there is provided a display apparatus including a display panel including a plurality of gate lines and a plurality of data line, which are arranged to intersect one another and thereby define a plurality of pixel areas, and a pixel provided in each of the plurality of pixel areas, a gate driver sequentially supplying a gate signal to the plurality of gate lines, and a data driver supplying data voltages to the plurality of data lines and comprising a source drive IC, wherein the source drive IC comprises a core portion, a first channel portion disposed outside one side of the core portion to receive data corresponding to a digital image signal from the core portion to output a data voltage corresponding to an analog image signal, a second channel portion disposed outside the other side of the core portion to receive data corresponding to a digital image signal from the core portion to output a data voltage corresponding to an analog image signal, a first resistor string provided inward from the one side of the core portion to generate a plurality of gamma voltages, a first resistance corrector provided between the first resistor string and the first channel portion, and a first connection line extending from the first resistor string to each of the first channel portion and the second channel portion and transferring the plurality of gamma voltages to the first channel portion and the second channel portion, wherein the first connection line extends to the first channel portion via the first resistance corrector.

In another aspect of the present disclosure, there is provided a method of manufacturing a source drive IC including a core portion, a first channel portion disposed outside one side of the core portion, and a second channel portion disposed outside the other side of the core portion, the method including a process of forming a first resistor string inward from the one side of the core portion and forming a first resistance corrector between the first resistor string and the first channel portion, a process of forming a first connection line extending from the first resistor string to the first channel portion via the first resistance corrector and extending the first resistor string to the second channel portion, and a process of correcting a resistance of the first resistance corrector.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
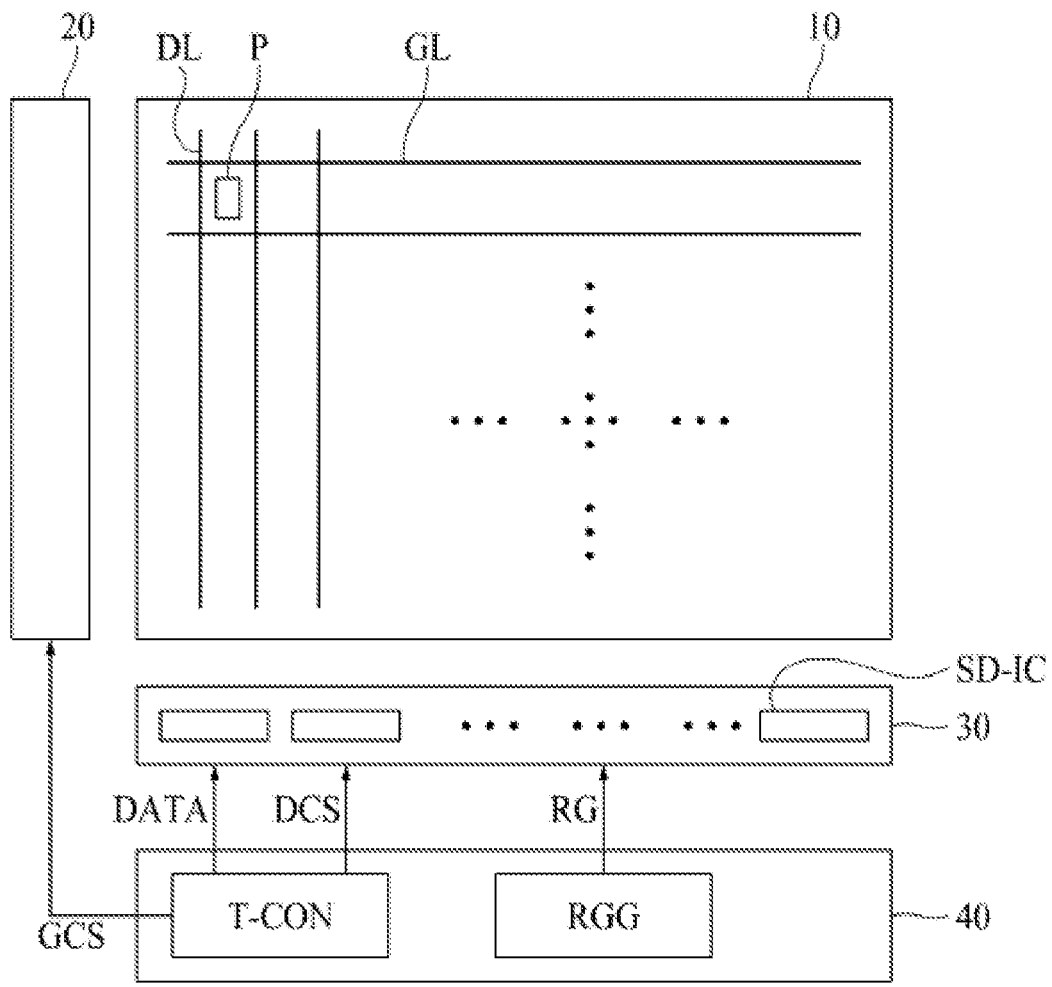
FIG. 1 is a system configuration diagram of a display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described in detail with reference to the accompanying drawings.

FIG. 1 is a system configuration diagram of a display apparatus according to an embodiment of the present disclosure.

As seen in FIG. 1, the display apparatus according to an embodiment of the present disclosure may include a display panel 10, a gate driver 20, a data driver 30, and a printed circuit board (PCB) 40.

The display panel 10 may include a plurality of gate lines GL and a plurality of data line DL, which are arranged to intersect one another and thereby define a plurality of pixel areas, and a pixel P provided in each of the plurality of pixel areas. The plurality of gate lines GL may be arranged in a widthwise direction and the plurality of data lines DL may be arranged in a lengthwise direction, but the present disclosure is not limited thereto. The display panel 10 may be implemented as various display panels, known to those skilled in the art, such as a liquid crystal display panel and an organic light emitting display panel.

The gate driver 20 may sequentially supply the gate signal having an on voltage or an off voltage to the plurality of gate lines GL according to a gate control signal GCS of a timing controller T-CON mounted on the PCB 40. The gate driver 20, as illustrated, may be disposed in one side (for example, a left side) of the display panel 10, but depending on the case, may be disposed in all of the one side and the other side (for example, the left side and a right side), facing each other, of the display panel 10. The gate driver 20 may include a plurality of gate drive integrated circuits (ICs) (not shown). The gate driver 20 may be implemented as a tape carrier package (TCP) type with the gate drive ICs mounted thereon, but is not limited thereto. In other embodiments, the gate driver ICs may be directly mounted on the display panel 10.

The data driver 30 may receive digital data DATA corresponding to a digital image signal from the timing controller T-CON mounted on the PCB 40 and may convert the received digital data DATA into a data voltage corresponding to an analog image signal (i.e., an analog voltage) to output the data voltage to a corresponding data line of the plurality of data lines DL. The data driver 30, as illustrated, may be disposed in one side (for example, a lower side) of the display panel 10, but depending on the case, may be disposed in all of the one side and the other side (for example, the lower side and an upper side), facing each other, of the display panel 10. The data driver 30 may include a plurality of source drive ICs SD-IC. The data driver 30 may be implemented as a TCP type with the source drive ICs SD-IC mounted thereon, but is not limited thereto.

The source drive ICs SD-IC may each include a shift register, a latch, a digital-to-analog converter (DAC), and an output buffer. Also, each of the source drive ICs SD-IC may further include a level shifter which shifts a voltage level of the digital data DATA, corresponding to the digital image signal input from the timing controller T-CON, to a desired voltage level.

The timing controller T-CON and a gamma reference voltage generator RGG may be provided on the PCB 40.

The timing controller T-CON may supply the gate control signal GCS to the gate driver 20 to control the gate driver 20. In detail, the timing controller T-CON may supply the gate control signal GCS including a gate start pulse (GSP), a gate shift clock (GSC), a gate output enable signal, and the like to the gate driver 20.

The timing controller T-CON may supply the digital data DATA corresponding to the digital image signal and a data control signal DCS to the data driver 30 to control the data driver 30. In detail, the timing controller T-CON may supply the data control signal DCS including a source start pulse (SSP), a source sampling clock (SSC), a source output enable signal, and the like to the data driver 30.

The gamma reference voltage generator RGG may include a plurality of resistors connected serially between a supply voltage source VDD and a ground voltage source GND, and a plurality of gamma reference voltages RG having different voltage values may be generated from nodes between the plurality of resistors. The plurality of gamma reference voltages RG generated by the gamma reference voltage generator RGG may be supplied to the data driver 30 (in more detail, the source drive ICs SD-IC), and the source drive ICs SD-IC may generate a plurality of gamma voltages.

Figure 2:
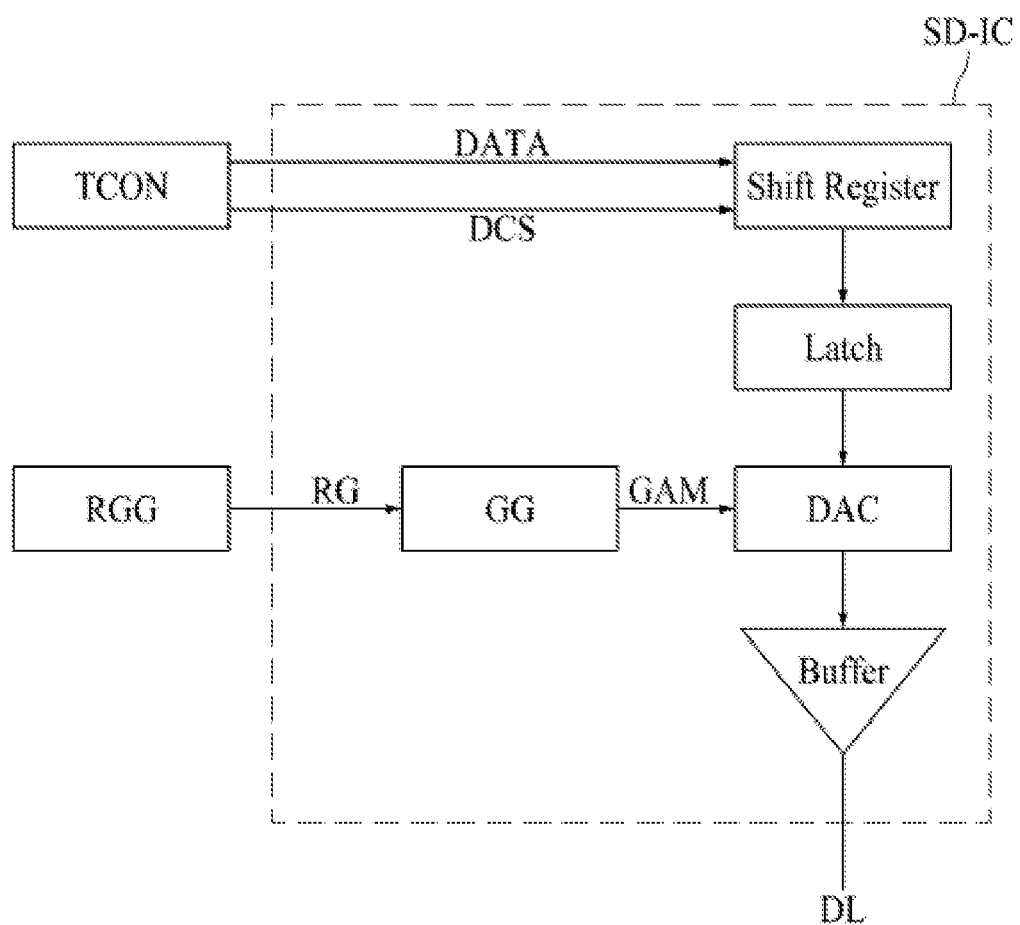
FIG. 2 is a block diagram illustrating a source drive IC SD-IC according to an embodiment of the present disclosure.

FIG. 2 is a block diagram illustrating a source drive IC SD-IC according to an embodiment of the present disclosure. In FIG. 2, an area illustrated by a dotted line represents an area of the source drive IC SD-IC.

As seen in FIG. 2, the source drive IC SD-IC according to an embodiment of the present disclosure may include a shift register, a latch, a gamma voltage generator GG, a DAC, and an output buffer.

The shift register may sequentially shift the source start pulse (SSP) supplied from the timing controller T-CON according to the source sampling clock (SSC) to generate and output a sampling signal.

The latch may sequentially sample and latch, by units of certain data, the digital data DATA supplied from the timing controller T-CON in response to the sampling signal from the shift register.

The gamma voltage generator GG may generate a gamma voltage GAM by using a gamma reference voltage RG generated by the gamma reference voltage generator RGG and may supply the gamma voltage GAM to the DAC. The gamma voltage generator GG may include a resistor string (R-String) RS.

The DAC may convert the digital data DATA from the latch 320 into a data voltage which is analog data, based on the gamma voltage GAM generated by the gamma voltage generator GG.

The output buffer may be serially connected to the data line DL of the display panel and may buffer the data voltage from the DAC to supply a buffered data voltage to the data line DL.

Figure 3:
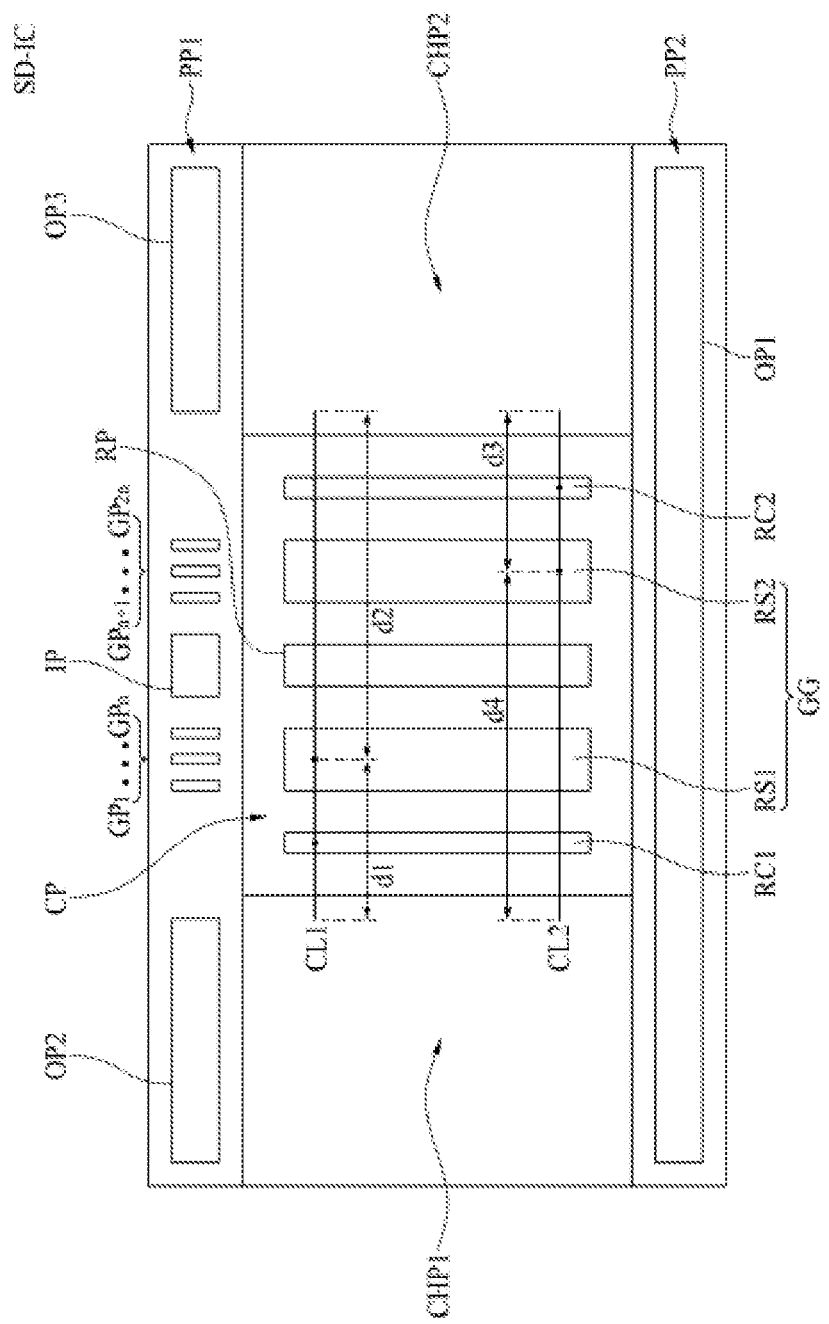
FIG. 3 is a diagram illustrating the arrangement of internal elements of a source drive IC SD-IC according to an embodiment of the present disclosure.

FIG. 3 is a diagram illustrating the arrangement of internal elements of a source drive IC SD-IC according to an embodiment of the present disclosure.

As seen in FIG. 3, the source drive IC SD-IC according to an embodiment of the present disclosure may include a core portion CP, a plurality of channel portion CHP1 and CHP2, and a plurality of pad portions (for example, first and second pad portions) PP1 and PP2.

The core portion CP may be disposed in a center region of the source drive IC SD-IC.

The core portion CP may receive data DATA corresponding to a digital image signal transferred from the timing controller T-CON and may transfer the received data DATA to the channel portions CHP1 and CHP2. In detail, the core portion CP may receive the data DATA transferred from the timing controller T-CON through an input signal pad IP of each of the pad portions PP1 and PP2. Therefore, the core portion CP may include a receiving portion RP including an interface for receiving the data DATA corresponding to the digital image signal. The receiving portion RP may be disposed in a center of the core portion CP.

In a case where the source drive IC SD-IC outputs data voltages to 2n (where n is a natural number equal to or more than one) number of data lines DL, the receiving portion RP of the core portion CP may transfer the data DATA to the first channel portion CHP1 including n number of channels among 2n number of channels and may transfer the data DATA to the second channel portion CHP2 including the other n channels.

The core portion CP may be supplied with a plurality of gamma reference voltages RG generated by the gamma reference voltage generator RGG to generate a plurality of gamma voltages GAM and may supply the plurality of gamma voltages GAM to the channel portions CHP1 and CHP2. In detail, the core portion CP may generate the plurality of gamma voltages GAM by using the plurality of gamma reference voltages RG which are generated by the gamma reference voltage generator RGG and is supplied through gamma pads GP1 to GPn and GPn+1 to GP2$n$ of each of the pad portions PP1 and PP2. Therefore, the core portion CP may include a gamma voltage generator GG which is supplied with the gamma reference voltage RG to generate the gamma voltage GAM.

The gamma voltage generator GG may include a first resistor string (R-String 1) RS1 and a second resistor string (R-String 2) RS2. The first resistor string RS1 may be disposed in one side (for example, a left side) of the core portion CP, and the second resistor string RS2 may be disposed in the other side (for example, a right side) of the core portion CP. Particularly, the first resistor string RS1 may be disposed in the one side (for example, the left side) of the core portion CP with respect to the receiving portion RP, and the second resistor string RS2 may be disposed in the other side (for example, the right side) of the core portion CP with respect to the receiving portion RP.

The first resistor string RS1 and the second resistor string RS2 may each include a plurality of resistors serially connected to one another. Each of the first resistor string RS1 and the second resistor string RS2 may divide a voltage biased to the plurality of resistors to generate the plurality of gamma voltages GAM corresponding to node-based gray voltages. At this time, the gamma reference voltages RG may be applied to both ends of the first resistor string RS1 and the second resistor string RS2 and a plurality of middle points therebetween.

The first resistor string RS1 may generate the plurality of gamma voltages GAM and may supply the plurality of gamma voltages GAM to the first channel portion CHP1 and the second channel portion CHP2. Therefore, a first connection line CL1 for connecting the first resistor string RS1 to the first channel portion CHP1 and connecting the first resistor string RS1 to the second channel portion CHP2 may be provided.

Moreover, the second resistor string RS2 may generate the plurality of gamma voltages GAM and may supply the plurality of gamma voltages GAM to the first channel portion CHP1 and the second channel portion CHP2. Therefore, a second connection line CL2 for connecting the second resistor string RS2 to the first channel portion CHP1 and connecting the second resistor string RS2 to the second channel portion CHP2 may be provided.

Only first connection line CL1 is illustrated, but may be provided in plurality corresponding to the number of gamma voltages GAM generated by the first resistor string RS1. Only second connection line CL2 is illustrated, but may be provided in plurality corresponding to the number of gamma voltages GAM generated by the second resistor string RS2.

The plurality of gamma voltages GAM generated by the first resistor string RS1 may be the same as the plurality of gamma voltages GAM generated by the second resistor string RS2, but the present disclosure is not limited thereto. The first resistor string RS1 may be connected to a channel which applies a data voltage to a pixel for implementing a first color and the second resistor string RS2 may be connected to a channel which applies a data voltage to a pixel for implementing a second color differing from the first color, but the present disclosure is not limited thereto. In other embodiments, the first resistor string RS1 and the second resistor string RS2 may be connected to channels which apply data voltages to pixels for implementing the same color.

In this case, a distance from the first resistor string RS1 to the first channel portion CHP1 may be shorter than a distance from the first resistor string RS1 to the second channel portion CHP2. That is, a first length d1 of a portion of the first connection line CL1 connecting the first resistor string RS1 to a channel of the first channel portion CHP1 may be shorter than a second length d2 of another portion of the first connection line CL1 connecting the first resistor string RS1 to a channel of the second channel portion CHP2. Therefore, a resistance of a portion of the first connection line CL1 corresponding to the first length d1 may be less than that of another portion of the first connection line CL1 corresponding to the second length d2.

Moreover, a distance from the second resistor string RS2 to the second channel portion CHP2 may be shorter than a distance from the second resistor string RS2 to the first channel portion CHP1. That is, a third length d3 of a portion of the second connection line CL2 connecting the second resistor string RS2 to a channel of the second channel portion CHP2 may be shorter than a fourth length d4 of another portion of the second connection line CL2 connecting the second resistor string RS2 to a channel of the first channel portion CHP1. Therefore, a resistance of a portion of the second connection line CL2 corresponding to the third length d3 may be less than that of another portion of the second connection line CL2 corresponding to the fourth length d4.

As described above, when a resistance difference between portions of the first connection line CL1 and a resistance difference between a portion of the second connection line CL2 occur, a time taken until an output voltage output through a channel connected to a portion having a high resistance increases up to a corresponding voltage may increase compared to an output voltage output through a channel connected to a portion having a low resistance, and thus, digital-to-analog conversion performed in a channel having a high resistance may be more delayed than digital-to-analog conversion performed in a channel having a low resistance, causing a luminance deviation where a screen corresponding to a channel having a high resistance is seen darker than a screen corresponding to a channel having a low resistance.

Therefore, in order to prevent a luminance deviation caused by a resistance difference between portions of the first connection line CL1 and a resistance difference between portions of the second connection line CL2, a plurality of resistance correctors RC1 and RC2 may be provided in the core portion CP.

The resistance correctors RC1 and RC2 may include a first resistance corrector RC1 provided between the first channel portion CHP1 and the first resistance string RS1 and a second resistance corrector RC2 provided between the second channel portion CHP2 and the second resistance string RS2.

The first resistance corrector RC1 may correct a resistance of a portion of the first connection line CL1 corresponding to the first length d1 (in more detail, may increase the resistance of the portion of the first connection line CL1 corresponding to the first length d1) to uniformize a resistance between the portion of the first connection line CL1 corresponding to the first length d1 and another portion of the first connection line CL1 corresponding to the second length d2. Therefore, the portion of the first connection line CL1 corresponding to the first length d1 may be connected to the first resistance corrector RC1, and thus, a resistance thereof may increase via the first resistance corrector RC1 and the other portion of the first connection line CL1 corresponding to the second length d2 may not be connected to the first resistance corrector RC1 and the second resistance corrector RC2.

The second resistance corrector RC2 may correct a resistance of a portion of the second connection line CL2 corresponding to the third length d3 (in more detail, may increase the resistance of the portion of the second connection line CL2 corresponding to the third length d3) to uniformize a resistance between the portion of the second connection line CL2 corresponding to the third length d3 and another portion of the second connection line CL2 corresponding to the fourth length d4. Therefore, the portion of the second connection line CL2 corresponding to the third length d3 may be connected to the second resistance corrector RC2, and thus, a resistance thereof may increase via the second resistance corrector RC2 and the other portion of the second connection line CL2 corresponding to the fourth length d4 may not be connected to the first resistance corrector RC1 and the second resistance corrector RC2.

The channel portions CHP1 and CHP2 may include a first channel portion CHP1 disposed outside one side (for example, a left side) of the core portion CP and a second channel portion CHP2 disposed outside the other side (for example, a right side) of the core portion CP.

The first channel portion CHP1 may include n number of left channels each of which receive data DATA corresponding to a digital image signal from the core portion CP to output a data voltage corresponding to an analog image signal. To this end, the first channel portion CHP1 may include n number of shift registers, n number of latches, n number of DACs, and n number of output buffers. That is, each of the n left channels may include a shift register, a latch, a DAC, and an output buffer, and each of data voltages output from the n left channels may be supplied to a corresponding data line.

The second channel portion CHP2 may include n number of right channels each of which receive data DATA corresponding to a digital image signal from the core portion CP to output a data voltage corresponding to an analog image signal. To this end, the second channel portion CHP2 may include n number of shift registers, n number of latches, n number of DACs, and n number of output buffers. That is, each of the n right channels may include a shift register, a latch, a DAC, and an output buffer, and each of data voltages output from the n right channels may be supplied to a corresponding data line.

The pad portions PP1 and PP2 may be provided in one area and the other area (for example, an upper area and a lower area) of the source drive IC SD-IC. In detail, the first pad portion PP1 may be provided outside an upper portion of each of the core portion CP and the channel portions CHP1 and CHP2, and the second pad portion PP2 may be provided outside a lower portion of each of the core portion CP and the channel portions CHP1 and CHP2. However, the present disclosure is not limited thereto, and a pad portion may be further provided outside a left portion of the first channel portion CHP1 and a pad portion may be further provided outside a right portion of the second channel portion CHP2.

The input signal pad IP and the gamma pads GP1 to GPn and GPn+1 to GP2n may be provided in the first pad portion PP1. The input signal pad IP may be a pad to which various signals transferred from the timing controller T-CON are input and may include a plurality of pads. The gamma pads GP1 to GPn and GPn+1 to GP2n may be pads to which the plurality of gamma reference voltages RG generated by the gamma reference voltage generator RGG are applied and may include a plurality of pads.

The input signal pad IP and the gamma pads GP1 to GPn and GPn+1 to GP2n may be provided outside an upper portion of the core portion CP to face the core portion CP. Particularly, the input signal pad IP may be provided at a position facing the receiving portion RP, and the gamma pads GP1 to GPn and GPn+1 to GP2n may be provided at positions facing the gamma voltage generator GG. In more detail, a plurality of first gamma pads GP1 to GPn may be provided at positions facing the first resistor string RS1, and a plurality of second gamma pads GPn+1 to GP2n may be provided at positions facing the second resistor string RS2.

A first output signal pad OP1 may be provided in the second pad portion PP2. The first output signal pad OP1 may be a pad which outputs a data voltage generated by each of the channel portions CHP1 and CHP2 to a data line and may include a plurality of pads.

A second output signal pad OP2 and a third output signal pad OP3 may be further provided in the first pad portion PP1. Like the first output signal pad OP1, each of the second output signal pad OP2 and the third output signal pad OP3 may be a pad which outputs a data voltage generated by each of the channel portions CHP1 and CHP2 to a data line and may include a plurality of pads. The second output signal pad OP2 may be provided at a position facing the first channel portion CHP1, and the third output signal pad OP3 may be provided at a position facing the second channel portion CHP2.

Although not shown, at least one of the input signal pad IP and the gamma pads GP1 to GPn and GPn+1 to GP2n may be provided at a position facing the core portion CP in an area of the second pad portion PP2, and the output signal pad OP may be provided at a position facing each of the channel portions CHP1 and CHP2 in the area of the second pad portion PP2.

Figure 4:
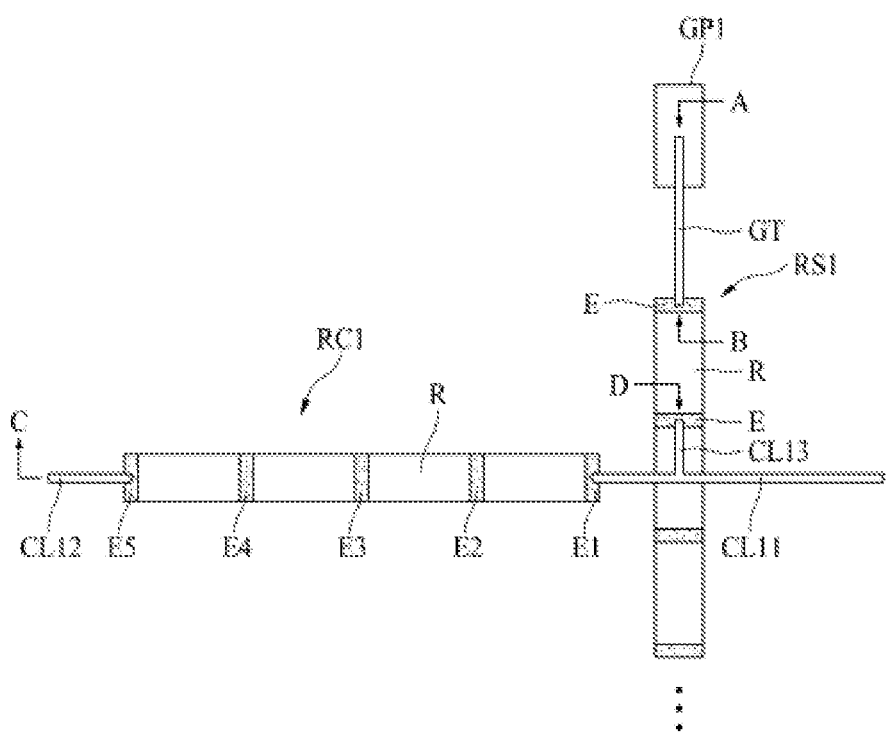
FIG. 4 is a plan view illustrating one gamma pad GP1, a portion of a first resistor string RS1, and a portion of a first resistance corrector RC1 among internal elements of a source drive IC SD-IC according to an embodiment of the present disclosure.

FIG. 4 is a plan view illustrating one gamma pad GP1, a portion of a first resistor string RS1, and a portion of a first resistance corrector RC1 among internal elements of a source drive IC SD-IC according to an embodiment of the present disclosure.

As seen in FIG. 4, the first resistor string RS1 may be provided under the one gamma pad GP1 to face the one gamma pad GP1, and the first resistance corrector RC1 may be provided in one side (in detail, a left side) of the first resistor string RS1.

The first resistor string RS1 may include a resistor R extending in a first direction (for example, a lengthwise direction) and a plurality of electrode structures E connected to the resistor R.

The one gamma pad GP1 may be connected to the first resistor string RS1 through a gamma tap GT. In detail, one end of the gamma tap GT may be connected to the one gamma pad GP1, and the other end of the gamma tap GT may be connected to one electrode structure E of the first resistor string RS1.

The first resistance corrector RC1 may include a resistor R extending in a second direction (for example, a widthwise direction) and a plurality of electrode structures E1 to E5 connected to the resistor R. However, the resistor R of the first resistance corrector RC1 may extend in the same first direction as the resistor R of the first resistor string RS1. The plurality of electrode structures E1 to E5 may be spaced apart from one another, and the number of electrode structures may be variously changed.

The first resistor string RS1 may be connected to the first channel portion CHP1 and the second channel portion CHP2 through a plurality of first connection lines CL11 to CL13. In this case, the first connection lines CL11 to CL13 may extend from the first resistor string RS1 to the first channel portion CHP1 via the first resistance corrector RC1.

The first connection lines CL11 to CL13 may include a first portion CL11, a second portion CL12, and a third portion CL13. The first portion CL11 and the second portion CL12 may extend in the widthwise direction, and the third portion CL13 may extend in the lengthwise direction. The first portion CL11 and the second portion CL12 may be spaced apart from each other with the first resistance corrector RC1 therebetween. One end of the first portion CL11 may be connected to one side of the first resistance corrector RC1, and the other end of the first portion CL11 may be connected to the second channel portion CHP2. One end of the second portion CL12 may be connected to the other side of the first resistance corrector RC1, and the other end of the second portion CL12 may be connected to the first channel portion CHP1. The third portion CL13 may connect the second portion CL12 to the first resistor string RS1, one end of the third portion CL13 may be connected to the second portion CL12, and the other end of the third portion CL13 may be connected to the first resistor string RS1.

Hereinafter, a connection structure between the one gamma pad GP1 and the first resistor string RS1 and a connection structure between the first resistor string RS1, the first connection lines CL11 to CL13, and the first resistance corrector RC1 will be described in detail with reference to a cross-sectional structure.

Figure 5:
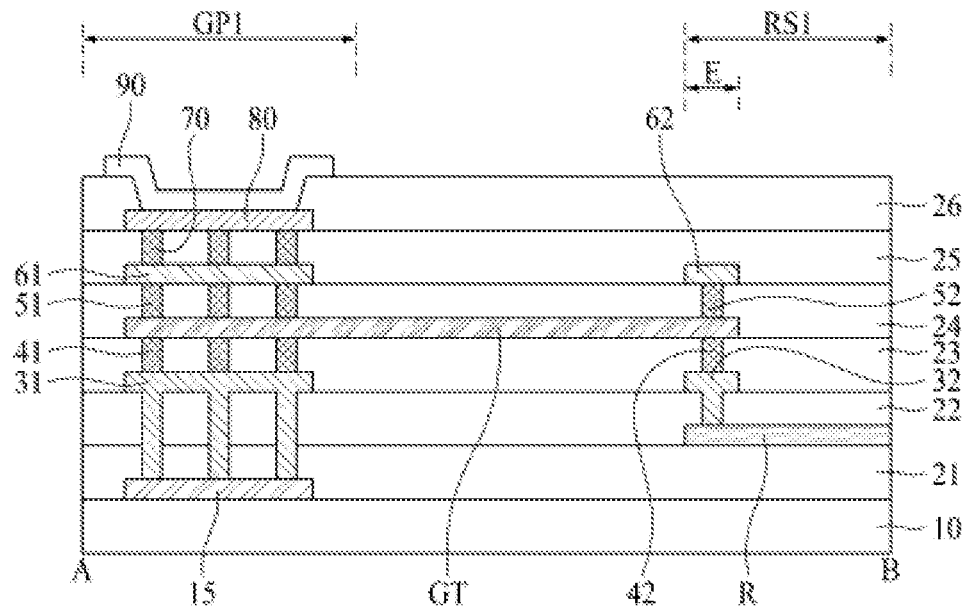
FIG. 5 is a cross-sectional view according to an embodiment taken along line A-B of FIG. 4 and is a cross-sectional view illustrating a connection structure between one gamma pad GP1 and a first resistor string RS1.

FIG. 5 is a cross-sectional view according to an embodiment taken along line A-B of FIG. 4 and is a cross-sectional view illustrating a connection structure between one gamma pad GP1 and a first resistor string RS1.

Referring to FIG. 5, a diode 15 may be provided in a gamma pad GP1 on a substrate 10. The diode 15 may prevent static electricity from occurring in the gamma pad GP1.

A first insulation layer 21 may be provided on the diode 15, a resistor R may be provided in an area of a first resistor string RS1 on the first insulation layer 21, and a second insulation layer 22 may be provided on the resistor R.

A plurality of first conductive layers 31 and 32 may be provided on the second insulation layer 22. The first conductive layers 31 and 32 may include a first contact electrode 31 and a second contact electrode 32. The first contact electrode 31 may be connected to the diode 15 through a plurality of contact holes provided in the first and second insulation layers 21 and 22, and the second contact electrode 32 may be connected to the resistor R through a contact hole provided in the second insulation layer 22.

A third insulation layer 23 may be provided on the first conductive layers 31 and 32, and a gamma tap GT may be provided as a second conductive layer on the third insulation layer 23. The gamma tap GT may be connected to the first contact electrode 31 and the second contact electrode 32 through a plurality of first contact layers 41 and 42 provided in the third insulation layer 23. The first contact layers 41 and 42 may include a first via 41 and a second via 42. The first via 41 may connect one end of the gamma tap GT to the first contact electrode 31, and the second via 42 may connect the other end of the gamma tap GT to the second contact electrode 32. An example where the first via 41 is provided in plurality and the second via 42 is provided as one is illustrated, but the present disclosure is not limited thereto.

A fourth insulation layer 24 may be provided on the gamma tap GT, and a plurality of third conductive layers 61 and 62 may be provided on the fourth insulation layer 24. The third conductive layers 61 and 62 may include a third contact electrode 61 and a fourth contact electrode 62. The third contact electrode 61 and the fourth contact electrode 62 may be connected to the gamma tap GP through a plurality of second contact layers 51 and 52 provided in the fourth insulation layer 24. The second contact layers 51 and 52 may include a third via 51 and a fourth via 52. The third via 51 may connect one end of the gamma tap GT to the third contact electrode 61, and the fourth via 52 may connect the other end of the gamma tap GT to the fourth contact electrode 62.

A fifth insulation layer 25 may be provided on the third conductive layers 61 and 62, and a fifth contact electrode 80 may be provided as a fourth conductive layer on the fifth insulation layer 25. The fifth contact electrode 80 may be connected to the third contact electrode 61 through a fifth via 70 which is a third contact layer provided in the fifth insulation layer 25.

A sixth insulation layer 26 may be provided on the fifth contact electrode 80, and a bump 90 may be provided in the sixth insulation layer 26. The bump 90 may be connected to the fifth contact electrode 80 through a contact hole provided in the sixth insulation layer 26.

As described above, according to an embodiment of the present disclosure, the diode 15, the first contact electrode 31, the first via 41, the gamma tap GT, the third via 51, the third contact electrode 61, the fifth via 70, the fifth contact electrode 80, and the bump 90 may be sequentially stacked in an area of the gamma pad GP1, and the resistor R, the second contact electrode 32, the second via 42, the gamma tap GT, the fourth via 52, and the fourth contact electrode 62 may be sequentially stacked in an area of the first resistor string RS1. In this case, a stacked structure of the second contact electrode 32, the second via 42, the gamma tap GT, the fourth via 52, and the fourth contact electrode 62 each provided in an area of the first resistor string RS1 may configure an electrode structure E of the first resistor string RS1.

The gamma tap GT may extend from an area of the gamma pad GP1 to an area of the first resistor string RS1, and thus, a gamma reference voltage RG supplied through the bump 90 provided in an area of the gamma pad GP1 may be supplied to the first resistor string RS1 through the gamma tap GT.

However, a stacked structure of an area of the gamma pad GP1 and an area of the first resistor string RS1 is not limited to the structure illustrated in FIG. 5.

Figure 6:
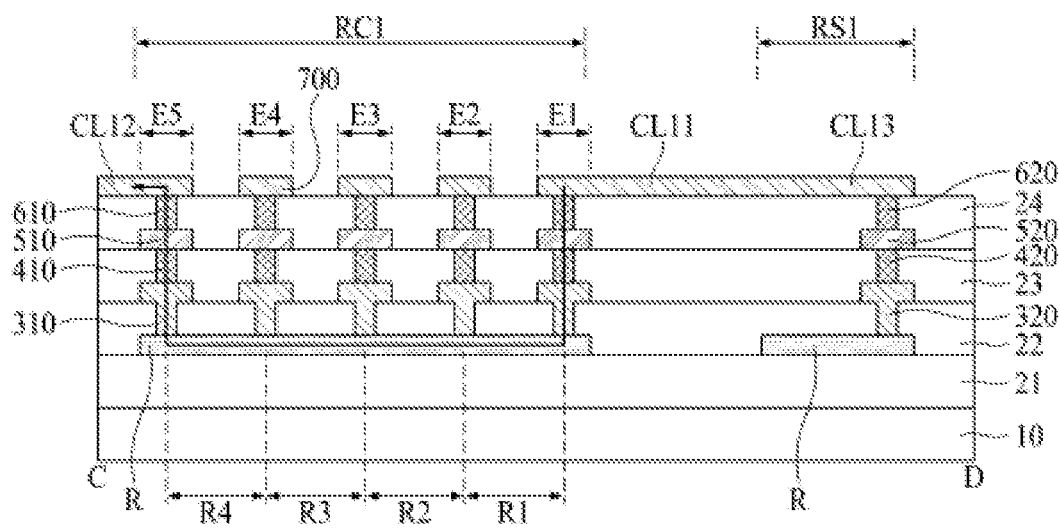
FIG. 6 is a cross-sectional view according to an embodiment taken along line C-D of FIG. 4 and is a cross-sectional view illustrating a connection structure between a first resistor string RS1, first connection lines CL11 to CL13, and a first resistance corrector RC1.

FIG. 6 is a cross-sectional view according to an embodiment taken along line C-D of FIG. 4 and is a cross-sectional view illustrating a connection structure between a first resistor string RS1, first connection lines CL11 to CL13, and a first resistance corrector RC1.

Referring to FIG. 6, a first insulation layer 21 may be provided on a substrate 10, a resistor R may be provided in each of a first resistor string RS1 area and a first resistance corrector RC1 area on the first insulation layer 21, and a second insulation layer 22 may be provided on the resistor R. The resistor R may include a semiconductor material such as polysilicon, but is not limited thereto and may include various materials such as metal.

A plurality of first conductive layers 310 and 320 may be provided on the second insulation layer 22. The first conductive layers 310 and 320 may include a first contact electrode 310 and a second contact electrode 320. The first contact electrode 310 may be provided in plurality, and the plurality of contact electrodes 310 may be connected to the resistor R of the first resistance corrector RC1 area through a plurality of contact holes provided in the second insulation layer 22, and the second contact electrode 320 may be connected to the resistor R of the first resistance corrector RC1 area through a contact hole provided in the second insulation layer 22.

A third insulation layer 23 may be provided on the first conductive layers 310 and 320, and a plurality of second conductive layers 510 and 520 may be provided on the third insulation layer 23. The second conductive layers 510 and 520 may include a third contact electrode 510 and a fourth contact electrode 520. The second conductive layers 510 and 520 may be connected to the first conductive layers 310 and 320 through a plurality of first contact layers 410 and 420 provided in the third insulation layer 23. The first contact layers 410 and 420 may include a first via 410 and a second via 420. The first via 410 may be provided in plurality, and the third contact electrode 510 may be provided in plurality. The plurality of first vias 410 may connect the plurality of third contact electrodes 510 to the plurality of first contact electrodes 310, and the second via 420 may connect the fourth contact electrode 520 to the second contact electrode 32. The plurality of third contact electrodes 510, the plurality of first vias 410, and the plurality of first contact electrodes 310 may correspond to one another in a one-to-one relationship.

A fourth insulation layer 24 may be provided on the second conductive layers 510 and 520, and a plurality of first connection lines CL11 to CL13 and a fifth contact electrode 700 may be provided on the fourth insulation layer 24. The first connection lines CL11 to CL13 and the fifth contact electrode 700 may be provided as a third conductive layer and may include the same material. The third conductive layer may be connected to the second conductive layers 510 and 520 through second contact layers 610 and 610 provided in the fourth insulation layer 24. The second contact layers 610 and 620 may include a third via 610 and a fourth via 620.

A second portion CL12 of the first connection lines CL11 to CL13 may be connected to the third contact electrode 510 through a third via 610, disposed in one side end, of a plurality of third vias 610, a first portion CL11 of the first connection lines CL11 to CL13 may be connected to the third contact electrode 510 through a third via 610, disposed in the other side end, of the plurality of third vias 610, and a third portion CL13 of the first connection lines CL11 to CL13 may be connected to the fourth contact electrode 520 through the fourth via 620. Also, the first portion CL11 of the first connection lines CL11 to CL13 may be connected to the third portion CL13 of the first connection lines CL11 to CL13.

Moreover, the fifth contact electrode 700 may be connected to at least one third contact electrode 510 through at least one third via 610, disposed in a region other than one side end and the other side end, of the plurality of third vias 610.

As described above, according to an embodiment of the present disclosure, the resistor R, the first contact electrode 310, the first via 410, the third contact electrode 510, the third via 610, and the first connection lines CL11 and CL12/fifth contact electrode 700 may be sequentially stacked in an area of the first resistance corrector RC1. In this case, when the first resistance corrector RC1 includes the first to fifth electrode structures E1 to E5 in a direction from the first portion CL11 of the first connection lines CL11 and CL12 to the second portion CL12 of the first connection lines CL11 and CL12, the first and fifth electrode structures E1 and E5 connected to the first connection lines CL11 and CL12 may be configured with a stacked structure of the first contact electrode 310, the first via 410, the third contact electrode 510, and the third via 610, and the second to fourth electrode structures E2 to E4 unconnected to the first connection lines CL11 and CL12 may be configured with a stacked structure of the first contact electrode 310, the first via 410, the third contact electrode 510, the third via 610, and the fifth contact electrode 700.

Moreover, the resistor R, the second contact electrode 320, the second via 420, the fourth contact electrode 520, the fourth via 620, and the first connection lines CL11 and CL13 may be sequentially stacked in an area of the first resistor string RS1.

Therefore, as in a current path referred to by an arrow, the first portion CL11 of the first connection lines CL11 to CL13 may be electrically connected to the second portion CL12 of the first connection lines CL11 to CL13 via first to fourth resistors R1 to R4 of the first resistance corrector RC1. The first resistor R1 may be a resistor between the first electrode structure E1 and the second electrode structure E2, the second resistor R2 may be a resistor between the second electrode structure E2 and the third electrode structure E3, the third resistor R3 may be a resistor between the third electrode structure E3 and the fourth electrode structure E4, and the fourth resistor R4 may be a resistor between the fourth electrode structure E4 and the fifth electrode structure E5.

As described above, according to an embodiment of the present disclosure, a resistance of each of the first connection lines CL11 to CL13 connecting the first resistor string RS1 to the first channel portion CHP1 may increase by using the first to fourth resistors R1 to R4 of the first resistance corrector RC1. In the drawing, an example where the first resistance corrector RC1 includes the first to fourth resistors R1 to R4 is illustrated, but the present disclosure is not limited thereto.

Moreover, according to an embodiment of the present disclosure, a total resistance level of the first resistance corrector RC1 may be easily adjusted by variously modifying a current path referred to by an arrow, and thus, a resistance of each of the first connection lines CL11 to CL13 connecting the first resistor string RS1 to the first channel portion CHP1 may be easily corrected. This will be described below.

FIGS. 7 to 13 are cross-sectional views illustrating a connection structure between a first resistor string RS1, first connection lines CL11 to CL13, and a first resistance corrector RC1 according to various embodiments of the present disclosure. Except for that a plurality of resistance correction lines 751 to 753 are further provided, FIGS. 7 to 13 are the same as the cross-sectional view of FIG. 6. Hereinafter, therefore, like reference numerals refer to like elements, and only different elements will be described.

Figure 7:
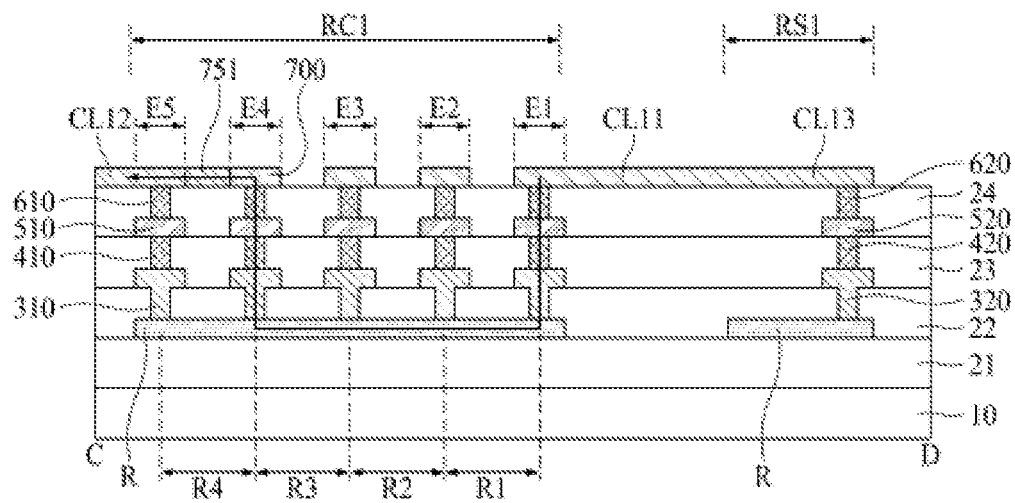
FIGS. 7, 8, 9, 10, 11, 12 and 13 are cross-sectional views illustrating a connection structure between a first resistor string RS1, first connection lines CL11 to CL13, and a first resistance corrector RC1 according to various embodiments of the present disclosure.

As seen in FIG. 7, a first resistance correction line 751 may be further provided between a fourth electrode structure E4 and a fifth electrode structure E5 of a first resistance corrector RC1.

The first resistance correction line 751 may be provided on a fourth insulation layer 24 and may connect a second portion CL12 of a plurality of first connection lines CL11 to CL13 to a fifth contact electrode 700 adjacent thereto. That is, one end of the first resistance correction line 751 may be connected to the second portion CL12 of the first connection lines CL11 to CL13, and the other end of the first resistance correction line 751 may be connected to the fifth contact electrode 700.

Since the first resistance correction line 751 connects the second portion CL12 of the first connection lines CL11 to CL13 to the fifth contact electrode 700, a first portion CL11 of the first connection lines CL11 to CL13 may be electrically connected to the second portion CL12 of the first connection lines CL11 to CL13 via first to third resistors R1 to R3 of the first resistance corrector RC1 like a current path referred to by an arrow.

In a structure of FIG. 7, a total resistance of the first resistance corrector RC1 may decrease compared to the structure of FIG. 6. Therefore, when a total resistance of the first resistance corrector RC1 is too high in the structure of FIG. 6, the first resistance correction line 751 may be further provided as in the structure of FIG. 7, thereby reducing a total resistance of the first resistance corrector RC1.

Figure 8:
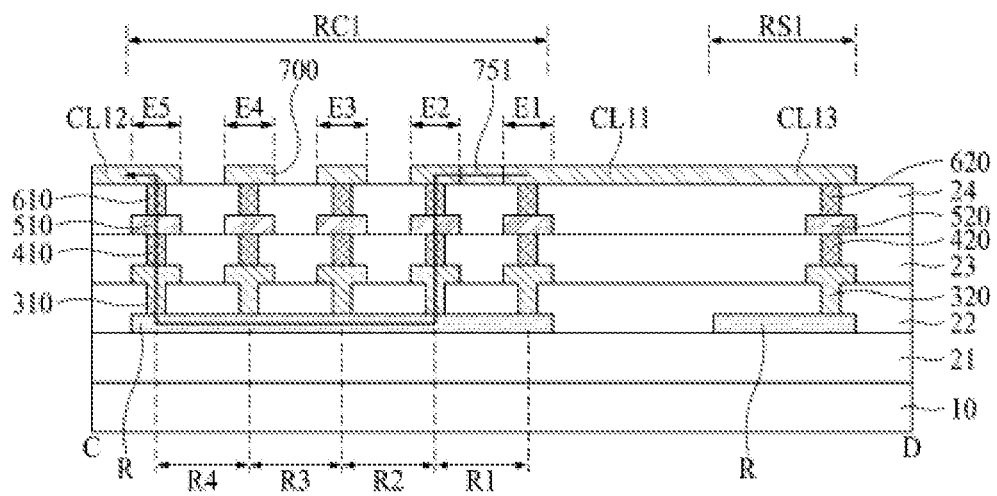

As seen in FIG. 8, a first resistance correction line 751 may be further provided between a first electrode structure E1 and a second electrode structure E2 of a first resistance corrector RC1.

The first resistance correction line 751 may be provided on a fourth insulation layer 24 and may connect a first portion CL11 of a plurality of first connection lines CL11 to CL13 to a fifth contact electrode 700 adjacent thereto. That is, one end of the first resistance correction line 751 may be connected to the first portion CL11 of the first connection lines CL11 to CL13, and the other end of the first resistance correction line 751 may be connected to the fifth contact electrode 700.

Since the first resistance correction line 751 connects the first portion CL11 of the first connection lines CL11 to CL13 to the fifth contact electrode 700, the first portion CL11 of the first connection lines CL11 to CL13 may be electrically connected to a second portion CL12 of the first connection lines CL11 to CL13 via second to fourth resistors R2 to R4 of the first resistance corrector RC1 like a current path referred to by an arrow.

In a structure of FIG. 8, a total resistance of the first resistance corrector RC1 may decrease compared to the structure of FIG. 6. Therefore, when a total resistance of the first resistance corrector RC1 is too high in the structure of FIG. 6, the first resistance correction line 751 may be further provided as in the structure of FIG. 8, thereby reducing a total resistance of the first resistance corrector RC1.

Figure 9:
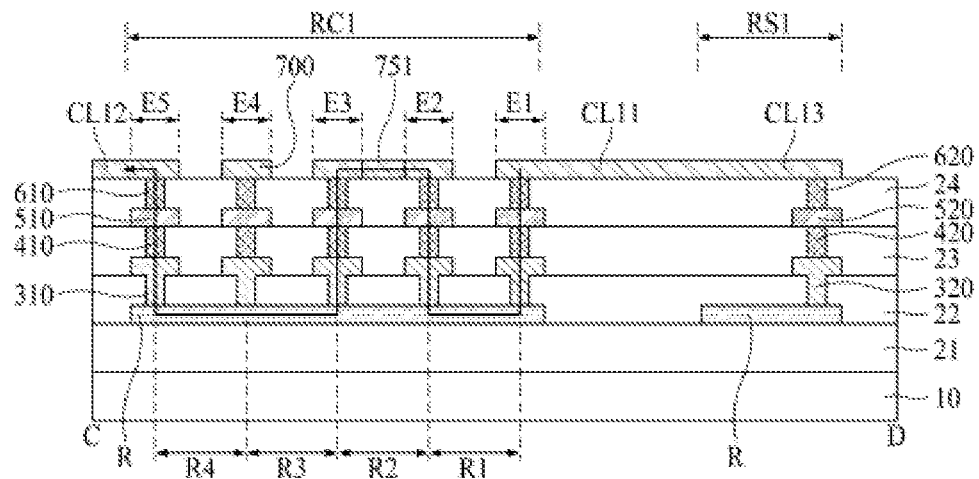

As seen in FIG. 9, a first resistance correction line 751 may be further provided between a second electrode structure E2 and a third electrode structure E3 of a first resistance corrector RC1.

The first resistance correction line 751 may be provided on a fourth insulation layer 24 and may connect two fifth contact electrodes 700 adjacent to each other. That is, one end of the first resistance correction line 751 may be connected to one of the two fifth contact electrodes 700, and the other end of the first resistance correction line 751 may be connected to the other of the two fifth contact electrodes 700.

Since the first resistance correction line 751 connects the two fifth contact electrodes 700 adjacent to each other, a first portion CL11 of first connection lines CL11 to CL13 may be electrically connected to a second portion CL12 of the first connection lines CL11 to CL13 via a first resistor R1, a third resistor R3, and a fourth resistor R4 of the first resistance corrector RC1 like a current path referred to by an arrow.

In a structure of FIG. 9, a total resistance of the first resistance corrector RC1 may decrease compared to the structure of FIG. 6. Therefore, when a total resistance of the first resistance corrector RC1 is too high in the structure of FIG. 6, the first resistance correction line 751 may be further provided as in the structure of FIG. 9, thereby reducing a total resistance of the first resistance corrector RC1.

Figure 10:
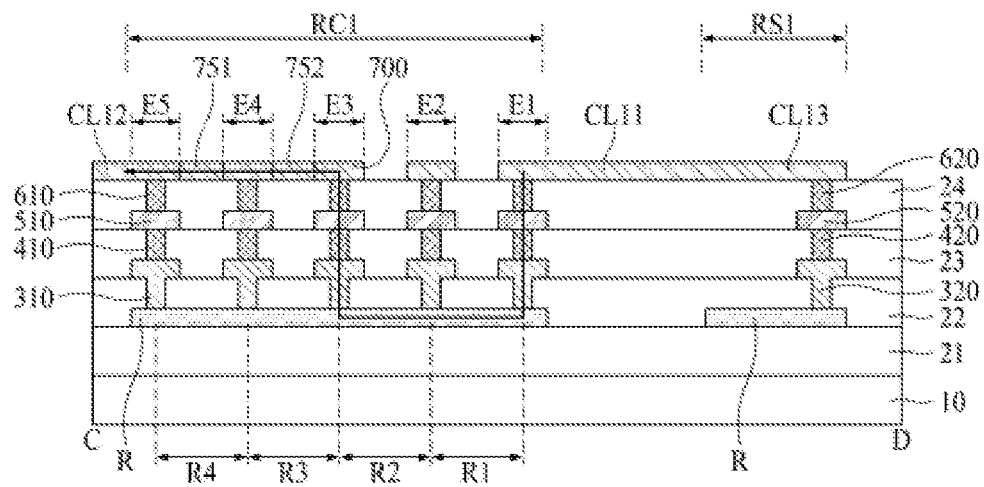

As seen in FIG. 10, a first resistance correction line 751 may be further provided between a fourth electrode structure E4 and a fifth electrode structure E5 of a first resistance corrector RC1, and a second resistance correction line 752 may be further provided between a third electrode structure E3 and the fourth electrode structure E4 of the first resistance corrector RC1.

The first resistance correction line 751 may be provided on a fourth insulation layer 24 and may connect a second portion CL12 of a plurality of first connection lines CL11 to CL13 to a fifth contact electrode 700 adjacent thereto. That is, one end of the first resistance correction line 751 may be connected to the second portion CL12 of the first connection lines CL11 to CL13, and the other end of the first resistance correction line 751 may be connected to the fifth contact electrode 700.

The second resistance correction line 752 may be provided on the fourth insulation layer 24 and may connect two fifth contact electrodes 700 adjacent to each other. That is, one end of the second resistance correction line 752 may be connected to one of the two fifth contact electrodes 700, and the other end of the second resistance correction line 752 may be connected to the other of the two fifth contact electrodes 700.

Since the first resistance correction line 751 and the second resistance correction line 752 are further provided, a first portion CL11 of the first connection lines CL11 to CL13 may be electrically connected to a second portion CL12 of the first connection lines CL11 to CL13 via first and second resistors R1 and R2 of the first resistance corrector RC1 like a current path referred to by an arrow.

Therefore, when a total resistance of the first resistance corrector RC1 is too high in the structure of FIG. 6, the first resistance correction line 751 and the second resistance correction line 752 may be further provided as in the structure of FIG. 10, thereby reducing a total resistance of the first resistance corrector RC1.

Figure 11:
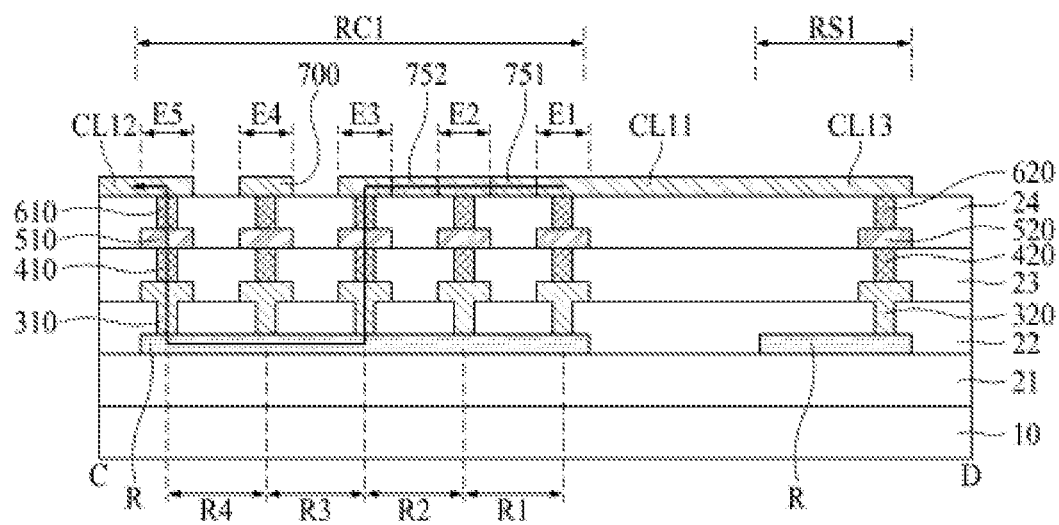

As seen in FIG. 11, a first resistance correction line 751 may be further provided between a first electrode structure E1 and a second electrode structure E2 of a first resistance corrector RC1, and a second resistance correction line 752 may be further provided between the second electrode structure E2 and a third electrode structure E3 of the first resistance corrector RC1.

The first resistance correction line 751 may be provided on a fourth insulation layer 24 and may connect a first portion CL11 of a plurality of first connection lines CL11 to CL13 to a fifth contact electrode 700 adjacent thereto. That is, one end of the first resistance correction line 751 may be connected to the first portion CL11 of the first connection lines CL11 to CL13, and the other end of the first resistance correction line 751 may be connected to the fifth contact electrode 700.

The second resistance correction line 752 may be provided on the fourth insulation layer 24 and may connect two fifth contact electrodes 700 adjacent to each other. That is, one end of the second resistance correction line 752 may be connected to one of the two fifth contact electrodes 700, and the other end of the second resistance correction line 752 may be connected to the other of the two fifth contact electrodes 700.

Since the first resistance correction line 751 and the second resistance correction line 752 are further provided, the first portion CL11 of the first connection lines CL11 to CL13 may be electrically connected to a second portion CL12 of the first connection lines CL11 to CL13 via third and fourth resistors R3 and R4 of the first resistance corrector RC1 like a current path referred to by an arrow.

Therefore, when a total resistance of the first resistance corrector RC1 is too high in the structure of FIG. 6, the first resistance correction line 751 and the second resistance correction line 752 may be further provided as in the structure of FIG. 11, thereby reducing a total resistance of the first resistance corrector RC1.

Figure 12:
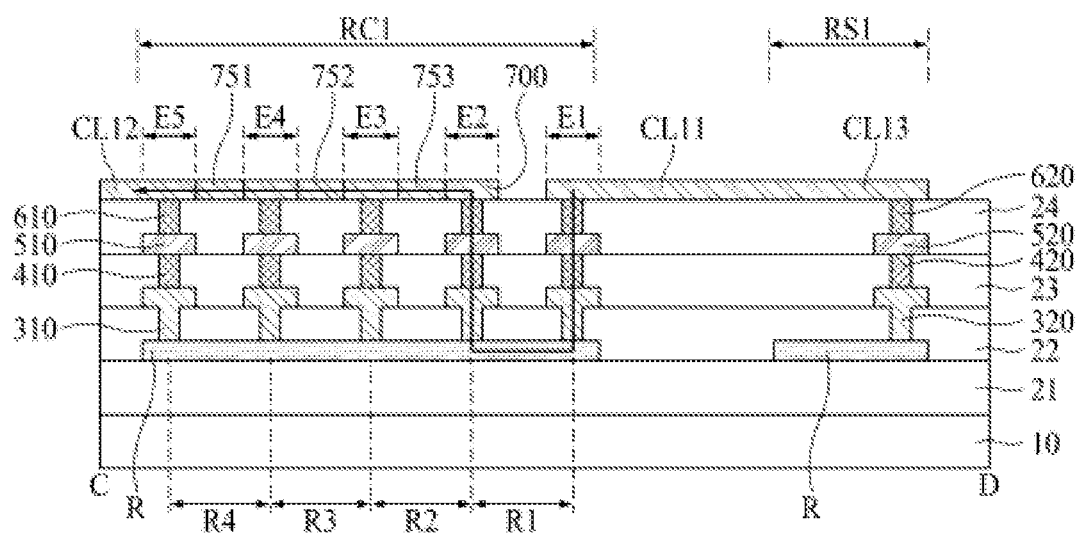

In FIG. 12, a third resistance correction line 753 may be further provided between a second electrode structure E2 and a third electrode structure E3 of a first resistance corrector RC1 compared to the structure of FIG. 10, and thus, a first portion CL11 of first connection lines CL11 to CL13 may be electrically connected to a second portion CL12 of the first connection lines CL11 to CL13 via a first resistor R1 of the first resistance corrector RC1.

Figure 13:
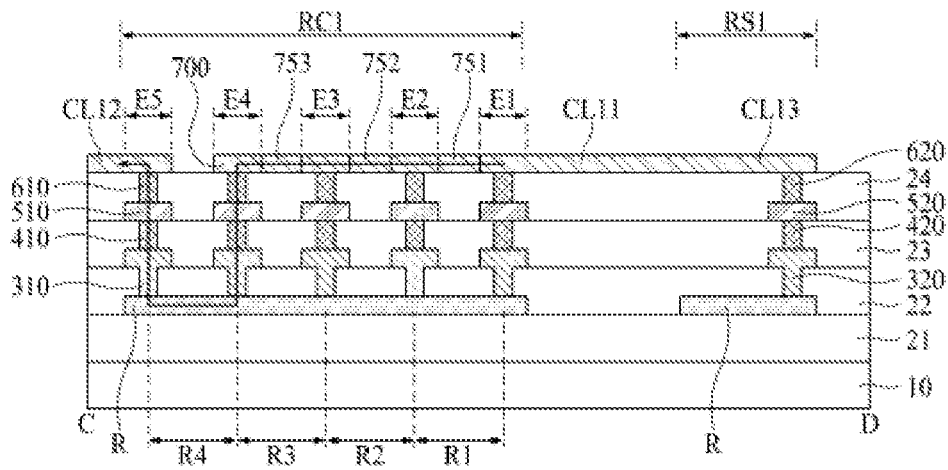

In FIG. 13, a third resistance correction line 753 may be further provided between a third electrode structure E3 and a fourth electrode structure E4 of a first resistance corrector RC1 compared to the structure of FIG. 11, and thus, a first portion CL11 of first connection lines CL11 to CL13 may be electrically connected to a second portion CL12 of the first connection lines CL11 to CL13 via a fourth resistor R4 of the first resistance corrector RC1.

As described above, according to various embodiments of the present disclosure, the resistance correction lines 751 to 753 may be appropriately added, thereby variously correcting a total resistance of the first resistance corrector RC1. Particularly, the number of electrode structures E1 to E5 of the first resistance corrector RC1 and the positions and number of the resistance correction lines 751 to 753 may be variously changed, and thus, a total resistance of the first resistance corrector RC1 may be easily adjusted.

Hereinabove, the connection structure between the one gamma pad GP1 and the first resistor string RS1 and the connection structure between the first resistor string RS1, the first connection line CL1, and the first resistance corrector RC1 have been described, but the present disclosure is not limited thereto and a connection structure between one other gamma pad GPn+1 and the second resistor string RS2 and a connection structure between the second resistor string RS2, the second connection line CL2, and the second resistance corrector RC2 may also be variously changed as in the above-described various embodiments.

Figure 14:
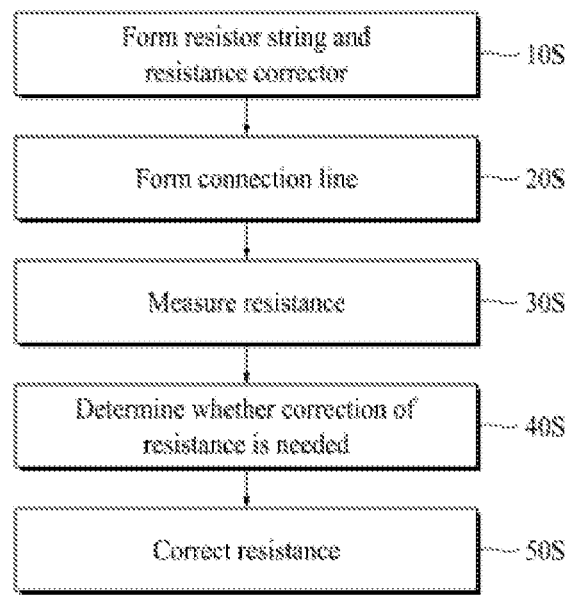
FIG. 14 is a manufacturing process view of a source drive IC SD-IC according to an embodiment of the present disclosure, and particularly, relates to a connection process between resistor strings RS1 and RS2, connection lines CL1 and CL2, and resistance correctors RC1 and RC2 of a core portion CP.

FIG. 14 is a manufacturing process view of a source drive IC SD-IC according to an embodiment of the present disclosure, and particularly, relates to a connection process between resistor strings RS1 and RS2, connection lines CL1 and CL2, and resistance correctors RC1 and RC2 of a core portion CP.

First, in step 10S, a plurality of resistor strings (for example, first and second resistor strings) RS1 and RS2 and a plurality of resistance correctors (for example, first and second resistance correctors) RC1 and RC2 may be formed in a core portion CP of a source drive IC SD-IC.

The first resistor string RS1 and the first resistance corrector RC1 may be formed in the structure illustrated in FIG. 6, and its repetitive description is omitted. The second resistor string RS2 may be formed in the same structure as that of the first resistor string RS1, and the second resistance corrector RC 2 may be formed in the same structure as that of the first resistance corrector RC 1.

Subsequently, a plurality of connection lines (for example, first and second connection lines) CL1 and CL2 for connecting the resistor strings RS1 and RS2 to first and second channel portions CHP1 and CHP2 respectively disposed in one side and the other side of the core portion CP may be formed in step 20S.

The first connection line CL1 may extend from the first resistor string RS1 to the first channel portion CHP1 via the first resistance corrector RC1 and may extend from the first resistor string RS1 to the second channel portion CHP2 directly.

The second connection line CL2 may extend from the second resistor string RS2 to the second channel portion CHP2 via the second resistance corrector RC2 and may extend from the second resistor string RS2 to the first channel portion CHP1 directly.

Subsequently, a resistance of each of the connection lines CL1 and CL2 may be measured in step 30S.

A resistance of a portion of the first connection line CL1 extending from the first resistor string RS1 to the first channel portion CHP1 via the first resistance corrector RC1 and a resistance of another portion of the first connection line CL1 extending from the first resistor string RS1 to the second channel portion CHP2 may be measured.

Moreover, a resistance of a portion of the second connection line CL2 extending from the second resistor string RS2 to the second channel portion CHP2 via the second resistance corrector RC2 and a resistance of another portion of the second connection line CL2 extending from the second resistor string RS2 to the first channel portion CHP1 may be measured.

Subsequently, whether correction of the resistances of the connection lines CL1 and CL2 is needed may be determined in step 40S.

When a deviation between a resistance of a portion of the first connection line CL1 and a resistance of another portion of the first connection line CL1 is within a predetermined range, correction of the resistance of the first connection line CL1 may not be needed, and when the deviation is beyond the predetermined range, correction of the resistance of the first connection line CL1 may be needed.

Moreover, when a deviation between a resistance of a portion of the second connection line CL2 and a resistance of another portion of the second connection line CL2 is within a predetermined range, correction of the resistance of the second connection line CL2 may not be needed, and when the deviation is beyond the predetermined range, correction of the resistance of the second connection line CL2 may be needed.

Subsequently, when it is determined in the above-described step that correction of the resistances of the connection lines CL1 and CL2 is needed, resistances of the resistance correctors RC1 and RC2 may be corrected in step 50S. The correction of the resistances of the resistance correctors RC1 and RC2 may be performed by adding a plurality of resistance correction lines 751 to 753.

As in FIGS. 7 to 13 described above, a level of a resistance of the first resistance corrector RC1 may be appropriately adjusted by additionally providing the resistance correction lines 751 to 753 to the first resistance corrector RC1, and moreover, a level of a resistance of the second resistance corrector RC2 may be appropriately adjusted through the same method as the first resistance corrector RC1.

According to the embodiments of the present disclosure, since a first connection line extends to a first channel portion via a first resistance corrector, a deviation between a resistance of a portion of the first connection line extending from a first resistor string to the first channel portion and a resistance of another portion of the first connection line extending from the first resistor string to a second channel portion may be reduced, thereby decreasing the delay or distorting of a driving signal.

According to the embodiments of the present disclosure, a resistance of the first resistance corrector may be corrected based on a result obtained by measuring the resistance of the portion of the first connection line and the resistance of the other portion of the first connection line after the first connection line is formed, and thus, the deviation between the resistance of the portion of the first connection line and the resistance of the other portion of the first connection line may be more precisely and efficiently reduced.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A source drive integrated circuit (IC) comprising:
   a core portion;
   a first channel portion disposed outside one side of the core portion to receive data corresponding to a digital image signal from the core portion to output a data voltage corresponding to an analog image signal;
   a second channel portion disposed outside the other side of the core portion to receive data corresponding to a digital image signal from the core portion to output a data voltage corresponding to an analog image signal;
   a first resistor string provided inward from the one side of the core portion to generate a plurality of gamma voltages;
   a first resistance corrector provided between the first resistor string and the first channel portion; and
   a first connection line extending from the first resistor string to each of the first channel portion and the second channel portion and transferring the plurality of gamma voltages to the first channel portion and the second channel portion,
   wherein the first connection line is connected to the first channel portion via the first resistance corrector.

2. The source drive IC of claim 1, wherein a distance from the first resistor string to the first channel portion is shorter than a distance from the first resistor string to the second channel portion.

3. The source drive IC of claim 1, wherein the first resistance corrector comprises:
   a resistor extending in a certain direction; and
   a plurality of electrode structures spaced apart from one another to contact the resistor.

4. The source drive IC of claim 3, wherein
   the first connection line comprises a first portion and a second portion spaced apart from each other,
   the first portion extends from one electrode structure of the first resistance corrector to the second channel portion, and
   the second portion extends from one other electrode structure of the first resistance corrector to the first channel portion.

5. The source drive IC of claim 3, wherein
   an electrode structure, connected to the first connection line, of the plurality of electrode structures of the first resistance corrector comprises a stacked structure of a first conductive layer connected to the resistor and a second conductive layer electrically connected to the first conductive layer, and
   an electrode structure, unconnected to the first connection line, of the plurality of electrode structures of the first resistance corrector comprises a stacked structure of a first conductive layer connected to the resistor, a second conductive layer electrically connected to the first conductive layer, and a third conductive layer electrically connected to the second conductive layer.

6. The source drive IC of claim 5, further comprising:
   a first gamma pad disposed outside the core portion to face the first resistor string; and
   a gamma tap connecting the gamma pad to the first resistor string,
   wherein the gamma tap is disposed on the same layer as the second conductive layer and comprises the same material as a material of the second conductive layer.

7. The source drive IC of claim 3, further comprising a resistance correction line connecting the plurality of electrode structures adjacent to one another.

8. The source drive IC of claim 7, wherein
   an electrode structure, unconnected to the first connection line, of the plurality of electrode structures of the first resistance corrector comprises a stacked structure of a first conductive layer connected to the resistor, a second conductive layer electrically connected to the first conductive layer, and a third conductive layer electrically connected to the second conductive layer, and
   the third conductive layer is provided in plurality, and the resistance correction line connects one of the plurality of third conductive layers to one other third conductive layer adjacent thereto.

9. The source drive IC of claim 7, wherein
   an electrode structure, unconnected to the first connection line, of the plurality of electrode structures of the first resistance corrector comprises a stacked structure of a first conductive layer connected to the resistor, a second conductive layer electrically connected to the first conductive layer, and a third conductive layer electrically connected to the second conductive layer, and
   the third conductive layer is provided in plurality, and the resistance correction line connects the first connection line to one third conductive layer, which is adjacent thereto, of the plurality of third conductive layers.

10. The source drive IC of claim 1, further comprising:
    a second resistor string provided inward from the other side of the core portion to generate a plurality of gamma voltages;
    a second resistance corrector provided between the second resistor string and the second channel portion; and
    a second connection line extending from the second resistor string to each of the first channel portion and the second channel portion and transferring the plurality of gamma voltages to the first channel portion and the second channel portion,
    wherein the second connection line extends to the second channel portion via the second resistance corrector.

11. The source drive IC of claim 10, wherein a distance from the second resistor string to the second channel portion is shorter than a distance from the second resistor string to the first channel portion.

12. A display apparatus comprising:
    a display panel including a plurality of gate lines and a plurality of data line, which are arranged to intersect one another and thereby define a plurality of pixel areas, and a pixel provided in each of the plurality of pixel areas;
    a gate driver sequentially supplying a gate signal to the plurality of gate lines; and
    a data driver supplying data voltages to the plurality of data lines and comprising a source drive integrated circuit (IC),
    wherein the source drive IC comprises:
    a core portion;
    a first channel portion disposed outside one side of the core portion to receive data corresponding to a digital image signal from the core portion to output a data voltage corresponding to an analog image signal;
    a second channel portion disposed outside the other side of the core portion to receive data corresponding to a digital image signal from the core portion to output a data voltage corresponding to an analog image signal;

a first resistor string provided inward from the one side of the core portion to generate a plurality of gamma voltages;

a first resistance corrector provided between the first resistor string and the first channel portion; and a first connection line extending from the first resistor string to each of the first channel portion and the second channel portion and transferring the plurality of gamma voltages to the first channel portion and the second channel portion, wherein the first connection line is connected to the first channel portion via the first resistance corrector.

13. The display apparatus of claim 12, wherein a distance from the first resistor string to the first channel portion is shorter than a distance from the first resistor string to the second channel portion.

14. The display apparatus of claim 12, wherein the first resistance corrector comprises:

a resistor extending in a certain direction; and a plurality of electrode structures spaced apart from one another to contact the resistor.

15. The display apparatus of claim 14, wherein the first connection line comprises a first portion and a second portion spaced apart from each other, the first portion extends from one electrode structure of the first resistance corrector to the second channel portion, and the second portion extends from one other electrode structure of the first resistance corrector to the first channel portion.

16. The display apparatus of claim 14, wherein an electrode structure, connected to the first connection line, of the plurality of electrode structures of the first resistance corrector comprises a stacked structure of a first conductive layer connected to the resistor and a second conductive layer electrically connected to the first conductive layer, and an electrode structure, unconnected to the first connection line, of the plurality of electrode structures of the first resistance corrector comprises a stacked structure of a first conductive layer connected to the resistor, a second conductive layer electrically connected to the first conductive layer, and a third conductive layer electrically connected to the second conductive layer.

17. The display apparatus of claim 14, further comprising a resistance correction line connecting the plurality of electrode structures adjacent to one another.

* * * * *